United States Patent [19]

Iyogi et al.

[11] Patent Number: 5,736,790
[45] Date of Patent: Apr. 7, 1998

[54] SEMICONDUCTOR CHIP, PACKAGE AND SEMICONDUCTOR DEVICE

[75] Inventors: Kiyoshi Iyogi; Kaoru Koiwa; Keiichi Yano; Hironori Asai, all of Kanagawaken, Japan

[73] Assignee: Kabushiki Kaisha Toshiba, Kawasaki, Japan

[21] Appl. No.: 710,769

[22] Filed: Sep. 20, 1996

[30] Foreign Application Priority Data

Sep. 21, 1995 [JP] Japan ................................ 7-243205

[51] Int. Cl.$^6$ ........................ H01L 23/48; H01L 23/52; H01L 29/40
[52] U.S. Cl. ............................................ 257/780; 257/781
[58] Field of Search ............................ 257/780, 781, 257/782, 784, 738, 779; 438/613, 614

[56] References Cited

U.S. PATENT DOCUMENTS

| | | | |
|---|---|---|---|
| 5,550,408 | 8/1996 | Kunitomo et al. | 257/783 |
| 5,600,180 | 2/1997 | Kusaka et al. | 257/780 |
| 5,640,052 | 6/1997 | Tsukamoto | 257/781 |

*Primary Examiner*—Mahshid D. Saadat
*Assistant Examiner*—S. V. Clark
*Attorney, Agent, or Firm*—Foley & Lardner

[57] ABSTRACT

Disclosed is a bump formed on a pad which is provided on either a semiconductor chip or a package or a wiring substrate for input or output thereof, for making electric connection on the pad. The bump has: a projection projecting from the pad; a ball having conductivity and located above the pad; and a conductive bonding material for bonding the pad for and the ball, wherein creep strength of the ball is larger than strength of the conductive bonding material. With another conductive bonding material provided on the other pad of a wiring substrate or a package, the ball of the bump of the semiconductor chip or the package is placed close to another pad of the wiring substrate or package. The conductive bonding material of the other pad is heated and melted to connect the ball and the other pad of the wiring substrate or package by the conductive bonding material.

20 Claims, 3 Drawing Sheets

SEMICONDUCTOR CHIP, PACKAGE AND SEMICONDUCTOR DEVICE

BACKGROUND OF THE INVENTION

1. Field of the Invention

The present invention relates to a semiconductor chip, a package, and a semiconductor device formed by connecting the semiconductor chip, the package and a wiring substrate. More particularly, the present invention relates to the improvement of confidence of the connecting portion of the semiconductor device which is formed by connecting members having a different thermal expansion coefficient with each other.

2. Description of the Prior Art

Semiconductor devices are formed by mounting a semiconductor chip such as LSI onto a package and implementing it to a printed board, and each part is electrically connected by inserting pins provided as input/output terminals. However, as the integration degree of LSI becomes higher and higher, it is required that the package to which LSI is mounted corresponds to the increase of pin number and to the pin pitch which becomes narrower. With the above circumstances, mounting of the package is changing from the conventional pin-insertion type to the surface mount types such as QFP (Quad Flat Package) type or SM-PGA (Surface Mount type-Pin grid Array) type.

However, in these surface mount type packages using pins or leads, the lower limit of the pitch of the terminal is high. For example, it is difficult to make the pitch narrower than 1.27 mm in PGA type, and 0.3 mm in QFP type. Moreover, the electric characteristic at pin and lead portions is remarkably deteriorated, thus it is difficult to correspond to the speed of the signal which becomes higher and higher.

In order to solve the above-mentioned problems, BGA (Ball Grid Array) type package has been developed. BGA packages are characterised in that a bump formed by a solder ball or the like is provided at the input/output section of the package base material, and the bump is melted to connect the input/output section of the package to the terminal of the printed board. Since BGA can realize a narrower pitch than that in the case where pins or leads are used, it becomes possible to use more pins and to make the package smaller. Among BGA packages, ceramic BGA package using highly thermally conductive ceramics such as aluminum nitride and the like is excellent in heat radiation and is very promising package in the current situation where the consumed electricity and the heat value are increasing with the high speed of LSI and the heat radiation of package is regarded as important.

However, the stress strain caused by the difference of the heat expansion coefficient between the package base material and the printed board when the BGA package is heated or cooled concentrates in the connecting portion formed by using the bump. Therefore, the connecting portion is likely to be broken and thus there are problems in the durability and the confidence of the connecting portion. Moreover, when the connecting method using the bump is applied for the connection between the semiconductor chip and the ceramics base material, and between the semiconductor chip and the printed wiring board, the connecting portion is readily broken similarly.

SUMMARY OF THE INVENTION

With these problems in mind, therefore, it is the primary object of the present invention to provide a bump which realizes a semiconductor device in which the connecting portion of the input/output section has high durability and confidence, and a semiconductor chip, a package and a printed board having that bump.

Furthermore, the secondary object is to provide a mounting method of the semiconductor chip or the package which enables to form the connecting portion of input/output section having high durability and confidence.

Furthermore, tertiary object of the present invention is to provide semiconductor device having high density which has high durability and confidence of the connecting portions for input and output and is excellent in the heat radiation and the electric characteristic, and a bump and a semiconductor package for realizing said semiconductor device.

In order to achieve the above-mentioned object, a bump formed on a pad which is provided on either a semiconductor chip or a package or a wiring substrate for input or output thereof, for making electric connection on the pad, according to the present invention comprises: a projection projecting from the pad; a ball having conductivity and located above the pad; and a conductive bonding material for bonding the pad for and the ball, wherein creep strength of the ball is larger than strength of the conductive bonding material.

The package according to the present invention has a bump which is formed on a pad for input or output of the package and used for making electric connection on the pad, and the bump comprises: a projection projecting from the pad; a ball having conductivity and located above the pad; and a conductive bonding material for bonding the pad for and the ball, wherein creep strength of the ball is larger than strength of the conductive bonding material.

The semiconductor chip according to the present invention has a bump which is formed on a pad for input or output of the semiconductor chip and used for making electric connection on the pad, and the bump comprises: a projection projecting from the pad; a ball having conductivity and located above the pad; and a conductive bonding material for bonding the pad for and the ball, wherein creep strength of the ball is larger than strength of the conductive bonding material.

The semiconductor device according to the present invention has: a package to which a semiconductor chip is mounted; a wiring substrate; at lease one pair of pads for input or output which are provided on the package and the wiring substrate, respectively; and a connecting portion for connecting said pair of pads, and the connecting portion comprises: a projection projecting from at least one of said pair of pads; a ball having conductivity and located between said pair of pads; and a conductive bonding material for bonding said pair of pads and the ball, in which creep strength of the ball is larger than strength of the conductive bonding material.

Another semiconductor device according to the present invention has: a semiconductor chip; a package; at least one pair of pads for input or output which are provided on the semiconductor chip and the package, respectively; and a connecting portion for connecting said pair of pads, wherein the connecting portion comprises: a projection projecting from at least one of said pair of pads; a ball having conductivity and located between said pair of pads; and a conductive bonding material for bonding said pair of pads and the ball, in which creep strength of the ball is larger than strength of the conductive bonding material.

Another semiconductor device according to the present invention has: a semiconductor chip; a wiring substrate; at least one pair of pads for input or output which are provided on the semiconductor chip and the package, respectively; and a connecting portion for connecting said pair of pads, wherein the connecting portion comprises: a projection projecting from at least one of said pair of pads; a ball having conductivity and located between said pair of pads; and a conductive bonding material for bonding said pair of pads and the ball, in which creep strength of the ball is larger than strength of the conductive bonding material.

A mounting method of a package, according to the present invention, comprises: preparing a package having a bump which is formed on a first pad for input or output of the package and used for making electric connection on the first pad, the bump comprising: a projection projecting from the first pad; a ball having conductivity and located above the first pad; and a first conductive bonding material for bonding the first pad and the ball, wherein creep strength of the ball is larger than strength of the first conductive bonding material; providing a second conductive bonding material on a second pad for input or output of a wiring substrate; placing the ball of the bump of the package close to the second pad of the wiring substrate; and heating and melting the second conductive bonding material of the second pad to connect the ball and the second pad of the wiring substrate by the second conductive bonding material.

A mounting method of a semiconductor chip, according to the present invention, comprising: preparing a semiconductor chip having a bump which is formed on a first pad for input or output of the semiconductor chip and used for making electric connection on the first pad, the bump comprising: a projection projecting from the first pad; a ball having conductivity and located above the first pad; and a first conductive bonding material for bonding the pad and the ball, wherein creep strength of the ball is larger than strength of the first conductive bonding material; providing a second conductive bonding material on a second pad for input and output of a wiring substrate or a package; placing the ball of the bump of the semiconductor chip close to the second pad of the wiring substrate or package; and heating and melting the second conductive bonding material of the second pad to connect the ball and the second pad of the wiring substrate or package by the second conductive bonding material.

According to the above-mentioned structure, the bonding strength and the durability of the bump portion of the BGA package and the flip chip are improved, thereby the connection confidence of the semiconductor device can be remarkably improved, and the industrial value thereof the quite large.

BRIEF DESCRIPTION OF THE DRAWINGS

The features and advantages of the according to the present invention over the proposed will be more clearly understood from the following description of the preferred embodiments of the present invention taken in conjunction with the accompanying drawings in which like reference numerals designate the same or similar elements or sections throughout the figures thereof and in which.

DETAILED DESCRIPTION OF THE PREFERRED EMBODIMENTS

Generally, damages at the connecting portions of BGA package are caused by the thermal hysteresis at the time of fixing by soldering when the BGA package is mounted to the wiring substrate (or printed wiring board), or by the environmental temperature change during the use. In either case, it is considered that warp is generated in the board or the like due to the expansion/shrinkage, and the internal stress accompanying therewith concentrates in the soldered connecting portion.

The general bump of BGA package has a structure that a ball formed by a soft solder or the like is attached to the input/output section of the package base material, and this solder ball is brought into contact with the corresponding input/output section of the wiring substrate and melted (reflowed) by heating, thereby the input/output section is bonded to form a soldered connecting portion. Thus obtained connecting portion has a shape like a letter O which is thin at the bonded end portion, and the stress at the time of heating and cooling is readily to concentrate in the vicinity of the bonding boundary between the package base material or the wiring substrate and the connecting portion, thereby breakage tends to be caused in the vicinity of the bonding boundary between the package base material and the connecting portion.

The breakage of the connecting portion, as understood from the above description, depends on how the stress works to the connecting portion. The shape and the length (the distance between the two input/output sections connected by the connecting portion) of the connecting portion are a part of the factor. And with regard to the length of the connecting portion, it is generally said that the confidence coefficient of the connecting portion is in proportion to a square of the length of the connecting portion. Namely, as the length of the connecting portion increases, the durability of the connecting portion rises. When it is tried to form a long connecting portion with the BGA package, such a contrivance is required in the reflowing process that a package base material is kept at a distance from the wiring substrate to increase the distance while the solder ball is melted. However, thus formed connecting portion tends to have a constricted shape like a letter X which is thin at the center thereof, and the stress concentrates in the center of the connecting portion to easily cause a crack.

Figure 1:
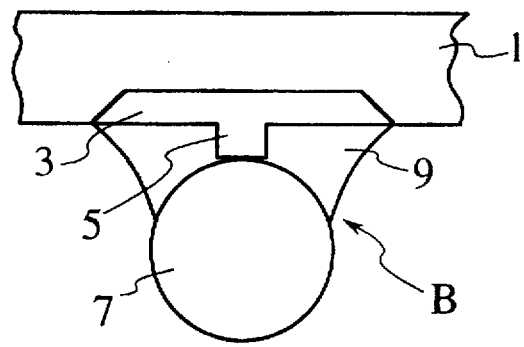
FIG. 1 is a schematic view illustrating the structure of the bump according to the present invention.

The present invention has been completed under this background, and the bump shown in FIG. 1 is the component of the connecting portion. FIG. 1 shows one embodiment of bump B provided on the input/output section of the semiconductor package 1. The bump B comprises a projection 5 projecting from a thin layer pad 3 which is one input/output section (but the wiring connected to the pad 3 is not shown), a ball 7 having the conductivity and a conductive bonding material 9 like a solder. The projection 5 projects in the connecting direction, that is, vertically to the surface of the pad 3, and the ball 7 is arranged on the projection 5 of the pad 3. The conductive bonding material 9 bonds said input/ output section 3, said projection 5 and said ball 7, and is constituted so that the creep strength of the ball 7 becomes larger than the creep strength of the conductive bonding material 9. Conventionally, the surface of the pad 3 had been formed smoothly so that there is caused no trouble concerning the surface roughness. However, it is the distinctive feature of the present invention to form a projection 5 on the pad 3, and this projection 5 has an important role in the production of a highly reliable semiconductor device.

Figure 2:
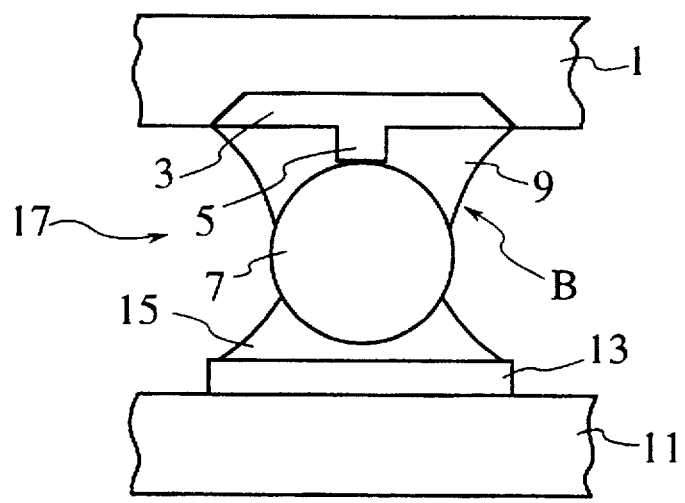
FIG. 2 is a schematic view illustrating the structure of the connecting portion which connects the input/output section of the semiconductor device using the bump of FIG. 1.

When bump B is brought into contact with a conductive bonding material which is applied to the pad for input and output on the wiring substrate, and the conductive bonding material is melted. Then, as shown in FIG. 2, the pad for input and output 13 on the wiring substrate 11 and the ball 7 are bonded by the conductive bonding material 15, and a connecting portion 17 which electrically connects the package 1 and the pads for input and output 3 and 13 of the wiring substrate 11 via the ball 7 is formed. The central portion of this connecting portion 17 tends to become thinner than the bonding end portion with both pads 3 and 13, but since there is located a ball having a high creep strength, the breakage at the central portion due to the stress caused at the time of heating and cooling can be suppressed. Furthermore, the bonding boundary between both pads 3 and 13 and the conductive bonding materials 9 and 15 is secured relatively largely, and the conductive bonding material 9 surrounding the projection 5 is supported by the projection 5 and the pad 3 integrally formed therewith against the stress in the direction along the bonding boundary caused at the time of heating and cooling to improve the resistance against stress. Therefore, breakage of the conductive bonding material 9 and peeling of the conductive bonding material 9 in the vicinity of the bonding boundary between the pad 3 and the conductive bonding material 9 can be suppressed. Accordingly, the connecting portion 17 has high durability against the stress as a whole.

In the embodiments of FIG. 1 and FIG. 2, the projection 5 is integrally formed with the pad 3. However, when the function of the present invention is considered, it is obvious that the projection 5 separately formed may be connected to the pad 3 using a bonding material and the like, so long as the bonding strength between the projection 5 and the pad 3 and the strength of the projection 5 per se are sufficient (that is, higher than the strength of the conductive bonding material). Furthermore, the projection 5 has only to have the function to prevent the conductive bonding material from moving relatively in the direction of the bonding boundary due to the stress. Therefore, the shape of the projection 5 and the projecting direction thereof may be any shape and any direction having the component in the vertical direction to the bonding boundary. Namely, the projection 5 may have an inclination. Moreover, a plurality of projections 5 may be formed.

The conductive bonding materials 9 and 15 used in the above embodiment can be properly selected according to need among materials having a low melting point and high conductivity in such a degree that it can be used as a bonding material. It is not required that the ball 7 having conductivity is formed with a conductive material for the whole portion thereof, and the ball 7 may have a structure obtained by coating with an electrically conductive material the surface of a core of a nonconductive body such as a resin having a strength and a heat resistance. In this case, if the step to coat the core of the ball with the conductive material is applied at the same time with, for example, the step to connect the package 1 and the wiring substrate 11 by using the conductive bonding materials 9 and 15, the ball 7 of bump B in FIG. 1 may be a ball of only a core uncoated with the conductive material. However, it is a matter of course that it is preferred that a ball having a conductive coating be used from the viewpoint of the reliability of the production. Furthermore, the material for forming the ball 7 is so selected that the creep strength of the ball 7 becomes larger than that of the conductive bonding material 9. However, if the strength of the ball 7 is excessively large, the stress due to the difference in the thermal expansion and shrinkage tends to rather concentrate in the conductive bonding material 9, and breakage from the ball tends to be caused at an early stage due to the drop of the share strength of the ball. Considering these promblems, it is preferred that the creep strength of the ball 7 be about 1.5 to 4 times as large as that of the conductive bonding material 9.

In the above-mentioned structure, the ball 7 can perform the function to maintain the interval between the package 1 and the wiring substrate 11, thereby connecting portion 17 longer than in the case of using a general BGA can be securely formed. This is effective, as described above, to improve the confidence coefficinet of the connecting portion. However, in order to exert this function, it is necessary that the ball 7 is not melt or deformed at the time of connecting step of the package 1 and the wiring substrate 11. Accordingly, it is required that the melting point of the material forming the ball 7 is higher than that of the conductive bonding materials 9 and 15. It is preferred that a material having a melting point which is 60° C. higher than that of the conductive bonding materials or more higher be used. Since the main role of the ball 7 is to reinforce the central portion of the connecting portion 17, it is not necessary to be in contact with the projection 5, and a conductive bonding material may intervene therebetween.

Based on the afore-mentioned property, examples of the material suitable for each portion constituting the bump B and the connecting portion 17 according to the present invention will be described here. For the conductive bonding materials 9 and 15, various solders or soldering pastes represented by Sn—Pb alloy can be used, and Sn—40Pb solder having a melting point of about 183° C. is easily obtainable and easily usable. As an example of the material constituting the ball 7, there can be mentioned various metals such as metal materials of various alloys such as 90%Pb—Sn alloy, Pb rich-Sn alloy, In alloy and the like, and metals and alloys used as a soft solder are easily handled. Particularly, Sn—95Pb solder having a melting point of about 270° C. is easily usable. When a ball obtained by coating a nonconductive core with a conductive material is used as the ball 7, as the material constituting the core, there can be mentioned resins such as glass epoxy resin, polyamide resin and polyimide resin, and the core formed with a material like these materials is coated with a metal material suitable for the ball structure. It is desired that the conductive bonding materials 9 and 15 are selected so as to be easily adapted to the material forming the pad and the material forming the ball, but such a combination that they react with each other to form a brittle compound should be avoided.

The pad provided on the semiconductor chip, the package and the wiring substrate as the input/output section is generally formed by a metal material having a small electric resistance by using a film-forming method such as sputtering, electroplating, surface printing and the like, and the pad 3 and the projection 5 of the present invention can be also formed by metal materials generally used. For example, aluminium, nickel, copper, gold, molybdenum, tungsten and the like can be utilized for making the pad 3 and the projection 5. In FIG. 1, the pad 3 is embedded in the package 1, but it may be placed on the package 1 similarly as the pad 13 in FIG. 2, and pads 3 and 13 may be in either form. According to need, a bonding material may be used for improving the adherence between the pad and the surface on which the pad is provided. Furthermore, a plating layer may be provided on the surfaces of the pad 3 and the projection 5, and when the pad 3 and the projection 5 are separately formed, it is required to select the materials thereof, considering the strength of each material and the strength after bonding.

The bump B of FIG. 1 may be formed in the input/output section provided on the face of the semiconductor chip side of the package. In this case, the wiring substrate 11 of FIG. 2 is substituted by a semiconductor chip, and the bump B is used for the connection of the semiconductor chip and the package. Furthermore, the bump B of FIG. 1 may be provided in the input/output section of a semiconductor chip such as a silicon chip and a gallium-arsenic chip, and in this case, the package 1 of FIG. 2 is substituted by a semiconductor chip, and the wiring substrate 11 of FIG. 2 is substituted by either of the package or the wiring substrate. Therefore, the bump B according to the present invention is used for the connection between the semiconductor chip and the package, and the connection between the semiconductor chip and the wiring substrate (flip chip connection). Namely, the connecting portion of FIG. 2 can be applied to either connection among the semiconductor chip, the package and the wiring substrate.

Figure 3:
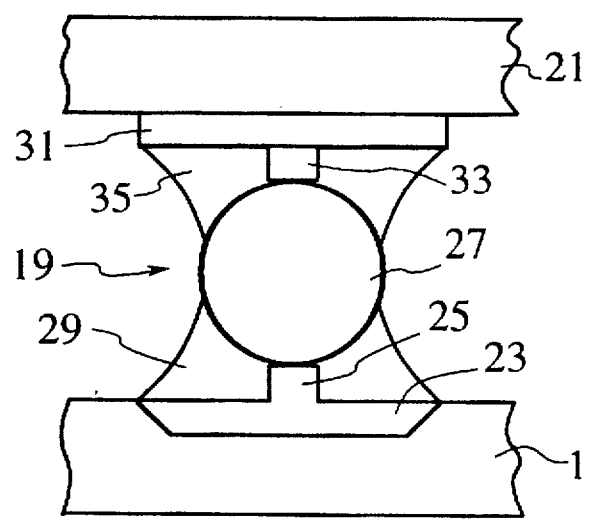
FIG. 3 is a schematic view illustrating the structure of an example applying the structure of the connecting portion of FIG. 2.

FIG. 3 shows one embodiment of the connecting portion applied for the projections provided on both of two pads for input and output to be connected. The connecting portion 19 of this embodiment is the example in which the package 1 and the semiconductor chip 21 are electrically connected, and can be formed by using a bump which is provided on the pad for input and output 23 of the package in the same manner as in FIG. 1. Specifically, a projection 25 is formed on the pad for input and output 23, and a ball 27 is bonded thereto by a conductive bonding material 29 to form a bump. On the other hand, a projection 33 is formed on the pad for input and output 31 of the semiconductor chip 21 and a conductive bonding material 35 is laminated thereon. The conductive bonding material 35 is then brought into contact with the ball 27 to reflow or melt the conductive bonding material 35, thereby a connecting portion 19 is formed in which both pads 23 and 31 are connected by the conductive bonding materials 29 and 35 and the ball 27. Alternatively, similar connecting portion 19 can be formed by providing a bump having the ball 27 not on the pad 23 on the package i but on the pad 31 on the semiconductor chip 21 side.

The size of the balls 7 and 27 can be properly set according to the length required for the connecting portions 17 and 19, the size of the pad, the pitch of the bump and the like. When the land diameter of the pad is set to about 0.9 mm, and the diameter of the ball to be used is set to from about 0.7 to 1.0 mm, preferably from 0.8 to 0.9 mm, the bump can be formed at a pitch of about 1.27 mm, and the connecting portion having a length of about 1.2 mm can be formed.

Balls 7 and 27 are not necessarily spherical, and elliptical, cylindrical and regular polyhedral balls may be of course usable, but spherical shape is most preferable from the viewpoint of the shape of a connecting portion to be formed.

Figure 4:
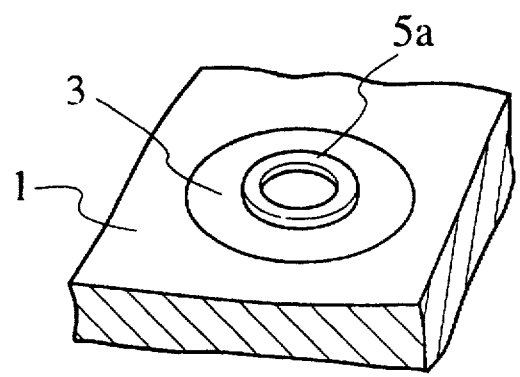
FIG. 4 is a perspective view showing a modification of the projection in the bump according to the present invention.
Figure 5:
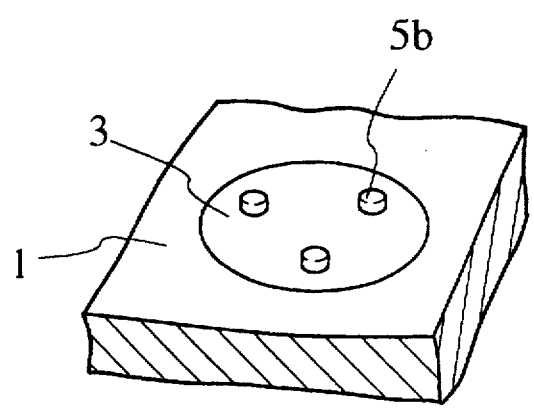
FIG. 5 is a perspective view showing another modification of the projection in the bump according to the present invention.

The above-mentioned projections 5, 25 and 33 act to reinforce the vicinity of the bonding boundary between the conductive bonding material and the input/output section, and this action is effectively exerted when the height of the projection is higher than 20 μm, preferably from 50 to 100 μm. Furthermore, the shape and the number of projections 5, 25 and 33 can be changed as required, for example, the annular projection 5a shown in FIG. 4 and three cylindrical projections 5b arranged on the concentric circle shown in FIG. 5 have an advantage that the location of the spherical ball can be easily fixed when the bump is formed.

The package 1 having the pad 3 in which the projection 5 in FIG. 1 is integrally formed can be adequately prepared by using general forming/processing method. Specifically, a ceramic package having a pad 3 provided with a projection 5, for example, can be prepared by the following method.

First, a hard metal plate with a through hole having the roughly same size with the section along the direction of the bonding boundary of the projection 5 is prepared, and an elastic material such as rubber is filled in this hole to obtain a forming die for forming the projection. On the other hand, the green sheet of the ceramic material of the package is surface-printed with a metallized paste in advance, and, a through hole is formed therein and filled with the metallized paste. At the position on the surface of this green sheet where the pad is provided, a metal material deformable by a die for forming a pad is placed, and the afore-mentioned forming die is pushed thereon. At this time, since there is caused a difference in the pushing force of the forming die between the metal portion and the elastic material portion, the metal material for forming the pad is deformed to project a portion abutting against the elastic material portion than a portion abutting against the metal portion of the forming die, thus a pad having the projection as in FIG. 1 is formed. At the same time, the portion other than the projection of the pad is embedded into the green sheet of the package base material as in FIG. 1. Thereafter, processes performed in the normal package preparation including the sintering operation of the green sheet are carried out to complete the ceramic package.

For the ceramic materials of the ceramic package, alumina, aluminium nitride, silica, silicon nitride, glass ceramics, mullite and the like, for example, can be utilized, and according to need, these basic materials can be properly selected. However, since the thermal expansion coefficient of aluminium nitride is close to the value of the semiconductor material, and also relatively close to the value of glass epoxy resin which is used as the wiring substrate, lead frame material, mold resin and the like, it is particularly preferable to use aluminium nitride as the package material in order to reduce the stress as much as possible at the time of expansion and shrinkage.

In order to provide a pad 29 having a projection 31 on the semiconductor chip 27, the following method, for example, can be taken. First, a pad of aluminium or the like is formed on the semiconductor chip by a common method, and a barrier metal film of, for example, Ti/Ni/Pd and the like is formed by sputtering on the while of the face of the semiconductor chip on which the pad is formed. A dry film having a thickness of about 10 μm is attached thereon by thermocompression bonding. Then, a film in a portion where a projection on a pad is to be formed is removed by using an alkaline solution to provide an opening, and a copper film is formed by the electroplating. Thereafter, the copper film formed in the portion not corresponding to the opening is removed with the dry film, and excessive barrier metal film is removed by etching, thereby a projection made Of copper is formed on the pad of the semiconductor chip.

Figure 6A:
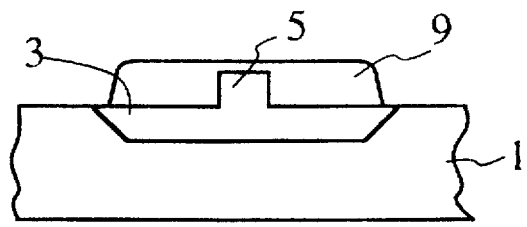
FIGS. 6A–6C are views illustrating the process to connect the input/output section of the semiconductor device by using the bump according to the present invention.
Figure 6B:
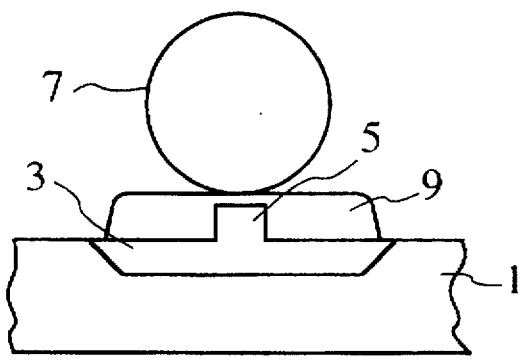
Figure 6C:
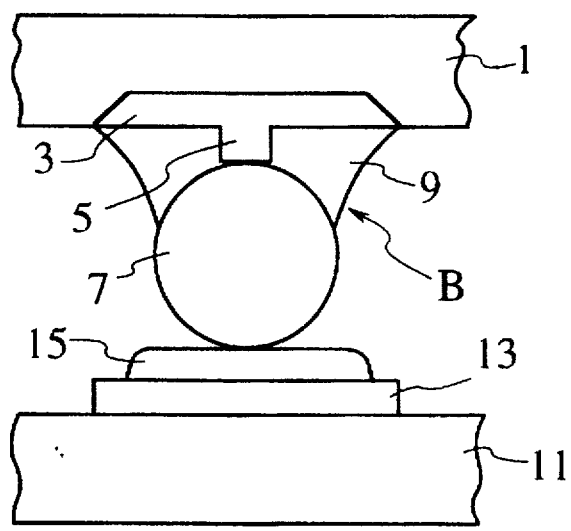

FIGS. 6A, 6B and 6C show a process to provide a bump B on the package 1 which is provided with a pad 3 having a projection 5 and to connect it with a wiring substrate 11.

First, as shown in FIG. 6A, a conductive bonding material 9 is laminated on the pad 8 by using, for example, a method such as a surface printing by means of a soldering paste. And as shown in FIG. 6B, a ball 7 is placed thereon to reflow the conductive bonding material 9, thereby the ball 7 and the pad 3 is bonded by the conductive bonding material 9 to obtain the package 1 having a bump B as shown in FIG. 1. Furthermore, as shown in FIG. 6C, a conductive bonding material 15 is laminated on the pad 13 of the wiring substrate 11 in the same manner described above, and the package 1 is arranged so that the ball 7 of the package 1 abuts against the conductive bonding material 15 to fellow the conductive bonding material 15, thereby a connecting portion 17 as shown in FIG. 2 is formed between the pad 3 of the package 1 and the pad 13 of the wiring substrate 11, thus mounting of the package 1 to the wiring substrate 11 is completed. Connection between the semiconductor chip and the package and connection between the semiconductor chip and the wiring substrate can be performed in the same manner described above.

It can be easily understood that the process to form the connection as shown in FIG. 2 is not limited to the method shown in FIGS. 6A, 6B and 6C. For example, even if the ball 7 is omitted from the bump B of FIG. 1, if a ball is bonded to the pad for input and output on the other side with a conductive bonding material, the connection of FIG. 2 can be formed similarly by confronting such a no-ball bump with that ball on the pad of the other side and reflowing.

For the pad for input and output of the general ceramic package, there is often used a material in which nickel or gold is plated on the surface of tungsten, and for the pad for input and output of the wiring substrate, there is widely used a material in which copper foil is bonded by an adhesive. When these pads are compared, copper is soft and the residual stress is hardly to work. On the other hand, nickel is hard and the stress concentration is easily to be caused. Furthermore, the land diameter of the pad on the wiring substrate is often larger than the pad on the package. Therefore, the vicinity of the bonding boundary of the pad on the package is more easily broken due to the stress concentration than the vicinity of the bonding boundary of the pad on the wiring substrate. Accordingly, in the connection under these conditions, since bonding of the pad on the package is likely to be weaker than bonding of the wiring substrate, a projection provided on the pad of the package acts effectively to prevent the breakage.

Namely, it is desired that to which pad the projection should be provided, and in which shape and how many the projection should be provided is properly set considering the points described above, for example, what kind of pad for input and output is formed in what size of land diameter, and the like.

EXAMPLES

The present invention will now be described in detail by way of Examples and Comparative Examples.

(Example 1)

After a through hole was formed on the green sheet of the alumina ceramics, a wiring was formed by surface printing using a metallized paste of tungsten and filling to the through hole, followed by lamination and press-bonding operation, a pad for input and output was also formed on the surface of the green sheet by surface printing with the metallized paste. And a cylindrical projection was formed in the center of the pad surface by printing using the metallized paste of tungsten, and sintered in a reduced atmosphere to obtain a base material for the ceramics package having a pad with a projection formed with tungsten. The size of the pad was 900 μm, the diameter of the projection was 400 μm, and the height of the projection was 100 μm. In addition, the surfaces of the pad and the projection were nickel/gold plated.

Then, a solder paste of Sn—40%Pb having a melting point of 183° C. and creep strength of 0.8 kg/mm$^2$ at 100° C. was coated on the pad and the projection, as the conductive bonding material by printing.

On the other hand, a ball having a diameter of 900 μm was formed by using a high-melting-point soft solder of Sn—95% Pb (melting point: 270° C., creep strength of 2.0 kg/mm$^2$ at 100° C.), placed on the solder paste layer, heat-treated at a temperature for melting the soft solder paste and bonded with the ball to obtain a BGA package.

Then, a solder paste of the same kind as described above was laminated by printing on the circular pad made of copper having a diameter of 1,100 μm which was formed in a predetermined region of a glass epoxy type wiring substrate, and the BGA package obtained above was placed thereon for reflowing at a temperature for melting the soft solder, thus the BGA package was mounted to the wiring substrage.

(Comparative Example 1)

A BGA package was formed in the same manner as in Example 1, except that a projection was not formed on the pad of the BGA package, and mounted to the wiring substrate similarly.

(Example 2)

A through hole was formed on a metal plate die for forming a projection on a pad, and rubber was filled in the through hole to obtain a forming die.

Then, wiring was conducted with a tungsten paste on a green sheet of aluminium nitride ceramics in the same manner as in Example 1, and a tungsten pad was formed on the surface of the green sheet by printing. The above-mentioned forming die was pushed thereon to form a green sheet having a pad with a projection as shown in FIG. 6A embedded therein. It was then sintered in a reduced atmosphere to obtain a base material for the ceramics package having a pad with a projection formed with tungsten. The size of the pad was 1.0 mm, the diameter of the projection was 500 μm, and the height of the projection was 80 μm. In addition, the surfaces of the pad and the projection were nickel/gold plated.

Thereafter, lamination of the conductive bonding material onto the pad, formation of BGA package including formation and bonding of a ball, and mounting thereof to the wiring substrate were conducted in the same manner as in Example 1.

(Comparative Example 2)

A BGA package was formed in the same manner as in Example 2, except that the through hole filled with rubber for forming a projection was not formed, and mounted to the wiring substrate similarly.

(Example 3)

A barrier metal film composed of Ti/Ni/Pd was formed on the semiconductor chip having an aluminium pad having a diameter of 200 μm on the surface thereof by sputtering, a dry film having a thickness of 10 μm was attached thereon by thermocompression bonding, the dry film in the central position of the pad was removed by using an alkaline solution to provide a hole of 20 microns square, and copper was laminated thereon by electroplating. Thereafter, other than the portion of the copper laminate formed in the hole portion was removed with the dry film, and the barrier metal film of other than the portion sandwiched between the remained copper laminate and the aluminium pad was removed by etching, thereby a semiconductor chip provided with an aluminium pad having a projection made of copper was obtained. The height of the projection was 20 μm.

A solder paste of Sn—40% Pb having a melting point of 183° C. was laminated on the pad and the projection of the semiconductor chip, as the conductive bonding material by plating. A ball having a diameter of 200 μm comprising a high-melting-point solder of Sn—95% Pb (melting point: 270° C.) was placed thereon, heated at a temperature for melting the solder paste and connected. This semiconductor chip was mounted on the wiring substrate as in the above-mentioned Example.

(Comparative Example 3)

A semiconductor chip having a ball was formed in the same manner as in Example 3, except that a projection was not formed on the pad of the semiconductor chip, and mounted to the Wiring substrate similarly.

(Evaluation of the confidence of the connecting portion)

In order to evaluate the confidence of the connecting portion in the semiconductor device in which the above-mentioned BGA package or semiconductor chip is mounted to the wiring substrate, either one of the cooling/heating cycle load tests (A) and (B) described below was performed. This test utilizes a fact that when crack or other defect is caused in the connecting portion, the electrical connection between the BGA package or the semiconductor chip and the wiring substrate is damaged to increase the electric resistance, and evaluates the confidence of the connecting portion by the change of the electric resistance.

During the cooling/heating cycle load test, the electric resistance between the package and the wiring substrate was measured every time after a predetermined cycle number has passed, and when the value reached two times as large as the initial resistance value, it was determined as poor connection, and the confidence of the connecting portion was evaluated by the cycle number when it was determined as poor connection. The obtained results are shown in Table 1.

Cooling/heating cycle load test (A)

Heating and cooling was repeated, designating one cycle as −85° C. (30 min.)–room temperature (5 min.)–+125° C. (30 min.).

Cooling/heating cycle load test (B)

Heating and cooling was repeated, designating one cycle as −40° C. (30 min.)–room temperature (5 min.)–+100° C. (30 min.).

TABLE 1

|  | Test | Cycle No. of Poor Connection |
| --- | --- | --- |
| Example 1 | A | >600 |
| Com. Ex. 1 | A | 300 |
| Example 2 | A | >650 |

TABLE 1-continued

|  | Test | Cycle No. of Poor Connection |
| --- | --- | --- |
| Com. Ex. 2 | A | 230 |
| Example 3 | B | >1500 |
| Com. Ex. 3 | B | 800 |

At the time when poor connection was determined in the cooling/heating cycle load test, the semiconductor devices of Comparative Examples 1 and 2 were cut vertically to the bonding boundary to observe the section of the connecting portion, and a crack was then observed in each conductive bonding material. Compared to them, in the connecting portion of the semiconductor devices of Examples 1 and 2, any crack or other defect was not observed. Furthermore, at the time of reaching 600 cycles, the resistance value was maintained within 110% of the initial value in either case. Therefore, it is obvious that the structure of the bump according to the present invention remarkably improves the durability and the confidence of the connecting portion formed at the time of mounting the package to the wiring substrate. Moreover, the package base material of the above-mentioned Examples 1 and 2 are alumina or aluminium nitride, and from the above results, it is easily expected that the confidence of the connecting portion will be also remarkably improved when silicon carbide and glass ceramics are used as the base material.

Concerning Comparative Example 3, at the time of judgement of poor connection, the section of the connecting portion was observed, and a crack was similarly observed in the conductive bonding material. As for Example 3, even after 1500 cycles have passed, the measured value of the electric resistance was kept within 120% of the initial value. Accordingly, it is obvious that the structure of the bump according to the present invention is effective for the connection for mounting a semiconductor chip.

As is obvious from the results of Examples and Comparative Examples, in the implementation using a bump according to the present invention, the influence of the internal stress affecting the bonding material of the connecting portion is eased by the projection formed in the pad for input and output. As a result, occurrence of cracks and progress thereof in the inside of the bonding material is suppressed. Furthermore, since the height of the bump is secured and the aspect ratio of the connecting portion becomes large, the durability and the confidence of the connecting portion are improved.

What is claimed is:

1. A bump formed on a pad which is provided on either a semiconductor chip or a package or a wiring substrate for input or output thereof, for making electric connection on the pad, comprising:

a projection projecting from the pad;

a ball having conductivity and located above the pad; and a conductive bonding material for bonding the pad for and the ball, wherein creep strength of the ball is larger than strength of the conductive bonding material.

2. The bump according to claim 1, wherein the projection is formed in a cylindrical or annular shape.

3. The bump according to claim 1, wherein the projection is integrally formed with the pad.

4. The bump according to claim 1, wherein the height of the projection is at least 20 um.

5. The bump according to claim 1, wherein the conductive bonding material is a solder.

6. The bump according to claim 1, wherein the ball has an outer surface portion composed of a conductive material which is a metal or an alloy and which has a melting point being at least 60° C. higher than the melting point of the conductive bonding material.

7. The bump according to claim 1, wherein the ball has a core which is composed of a resin or an inorganic material.

8. A package having a bump which is formed on a pad for input or output of the package and used for making electric connection on the pad, the bump comprising:

a projection projecting from the pad;

a ball having conductivity and located above the pad; and a conductive bonding material for bonding the pad for and the ball, wherein creep strength of the ball is larger than strength of the conductive bonding material.

9. The package according to claim 8, wherein a base material of the package is ceramics.

10. The package according to claim 9, wherein the ceramics is selected from the group consisting of aluminium nitride, alumina and silicon nitride.

11. A semiconductor chip having a bump which is formed on a pad for input or output of the semiconductor chip and used for making electric connection on the pad, the bump comprising:

a projection projecting from the pad;

a ball having conductivity and located above the pad; and a conductive bonding material for bonding the pad for and the ball, wherein creep strength of the ball is larger than strength of the conductive bonding material.

12. A semiconductor device having: a package to which a semiconductor chip is mounted; a wiring substrate; at lease one pair of pads for input or output which are provided on the package and the wiring substrate, respectively; and a connecting portion for connecting said pair of pads, wherein the connecting portion comprises:

a projection projecting from at least one of said pair of pads;

a ball having conductivity and located between said pair of pads; and a conductive bonding material for bonding said pair of pads and the ball, in which creep strength of the ball is larger than strength of the conductive bonding material.

13. The semiconductor device according to claim 12, wherein the projection is formed on the pad provided on the package.

14. A semiconductor device having: a semiconductor chip; a package; at least one pair of pads for input or output which are provided on the semiconductor chip and the package, respectively; and a connecting portion for connecting said pair of pads, wherein the connecting portion comprises:

a projection projecting from at least one of said pair of pads;

a ball having conductivity and located between said pair of pads; and a conductive bonding material for bonding said pair of pads and the ball, in which creep strength of the ball is larger than strength of the conductive bonding material.

15. The semiconductor device according to claim 14, wherein the projection is formed on the pad provided on the package.

16. The semiconductor device according to claim 14, wherein the projection is formed on the pad provided on the semiconductor chip.

17. A semiconductor device having: a semiconductor chip; a wiring substrate; at least one pair of pads for input or output which are provided on the semiconductor chip and the package, respectively; and a connecting portion for connecting said pair of pads, wherein the connecting portion comprises:

a projection projecting from at least one of said pair of pads;

a ball having conductivity and located between said pair of pads; and a conductive bonding material for bonding said pair of pads and the ball, in which creep strength of the ball is larger than strength of the conductive bonding material.

18. The semiconductor device according to claim 17, wherein the projection is formed on the pad provided on the semiconductor chip.

19. A mounting method of a package, comprising: preparing a package having a bump which is formed on a first pad for input or output of the package and used for making electric connection on the first pad, the bump comprising: a projection projecting from the first pad; a ball having conductivity and located above the first pad; and a first conductive bonding material for bonding the first pad and the ball, wherein creep strength of the ball is larger than strength of the first conductive bonding material;

providing a second conductive bonding material on a second pad for input or output of a wiring substrate;

placing the ball of the bump of the package close to the second pad of the wiring substrate; and heating and melting the second conductive bonding material of the second pad to connect the ball and the second pad of the wiring substrate by the second conductive bonding material.

20. A mounting method of a semiconductor chip, comprising:

preparing a semiconductor chip having a bump which is formed on a first pad for input or output of the semiconductor chip and used for making electric connection on the first pad, the bump comprising: a projection projecting from the first pad; a ball having conductivity and located above the first pad; and a first conductive bonding material for bonding the pad and the ball, wherein creep strength of the ball is larger than strength of the first conductive bonding material;

providing a second conductive bonding material on a second pad for input and output of a wiring substrate or a package;

placing the ball of the bump of the semiconductor chip close to the second pad of the wiring substrate or package; and heating and melting the second conductive bonding material of the second pad to connect the ball and the second pad of the wiring substrate or package by the second conductive bonding material.

* * * * *